United States Patent
Ishii et al.

(10) Patent No.: US 10,300,665 B2
(45) Date of Patent: May 28, 2019

(54) GAS-PERMEABLE MEMBER AND METHOD FOR PRODUCING THE SAME

(71) Applicant: NITTO DENKO CORPORATION, Ibaraki-shi, Osaka (JP)

(72) Inventors: Kyoko Ishii, Osaka (JP); Youzou Yano, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 82 days.

(21) Appl. No.: 15/304,788

(22) PCT Filed: Apr. 8, 2015

(86) PCT No.: PCT/JP2015/001987
§ 371 (c)(1),
(2) Date: Oct. 17, 2016

(87) PCT Pub. No.: WO2015/159515
PCT Pub. Date: Oct. 22, 2015

(65) Prior Publication Data
US 2017/0036393 A1    Feb. 9, 2017

(30) Foreign Application Priority Data
Apr. 18, 2014   (JP) .................................. 2014-085993

(51) Int. Cl.
*B32B 37/00*   (2006.01)
*B29C 65/00*   (2006.01)
(Continued)

(52) U.S. Cl.
CPC ........ *B29C 66/81433* (2013.01); *B29C 65/08* (2013.01); *B29C 66/112* (2013.01);
(Continued)

(58) Field of Classification Search
CPC .................... B29C 65/08; B29C 66/81433; B29C 66/112; B29C 66/1122; B29C 66/131;
(Continued)

(56) References Cited

U.S. PATENT DOCUMENTS

| 4,767,492 A * | 8/1988 | Fukusima | B29C 65/08 |
| | | | 156/580.2 |
| 5,746,856 A * | 5/1998 | Hendershot | B29C 66/65 |
| | | | 156/73.4 |

(Continued)

FOREIGN PATENT DOCUMENTS

| JP | 58-193114 | 11/1983 |
| JP | 61-024427 | 2/1986 |

(Continued)

OTHER PUBLICATIONS

International Search Report from PCT/JP2015/001987 dated Jul. 7, 2015, 4 pages. (In English and the original Japanese.).

(Continued)

*Primary Examiner* — James D Sells
(74) *Attorney, Agent, or Firm* — Hamre, Schumann, Mueller & Larson, P.C.

(57) ABSTRACT

A gas-permeable porous fluororesin membrane (4) made of a fluororesin is welded to a resin component (2) made of a thermoplastic resin using a welding horn (62) having a working surface (62*p*) adapted to be brought into contact with a work object and provided with a projection (62*t*). The working surface (62*p*) of the welding horn (62) is provided with, for example, a plurality of projections (62*t*). The plurality of projections (62*t*) may be arranged in a grid pattern on the working surface (62*p*).

8 Claims, 5 Drawing Sheets

(51) Int. Cl.
| | |
|---|---|
| *B29C 65/08* | (2006.01) |
| *F21V 31/03* | (2006.01) |
| *H05K 5/02* | (2006.01) |
| *F21S 45/30* | (2018.01) |
| *B29C 65/18* | (2006.01) |
| *B29L 31/00* | (2006.01) |
| *B29L 31/34* | (2006.01) |
| *B29C 65/58* | (2006.01) |
| *B29C 65/78* | (2006.01) |
| *B29K 309/08* | (2006.01) |
| *B29K 627/18* | (2006.01) |

(52) U.S. Cl.
CPC ........ *B29C 66/1122* (2013.01); *B29C 66/131* (2013.01); *B29C 66/232* (2013.01); *B29C 66/5326* (2013.01); *B29C 66/5346* (2013.01); *B29C 66/71* (2013.01); *B29C 66/712* (2013.01); *B29C 66/727* (2013.01); *B29C 66/7352* (2013.01); *B29C 66/7392* (2013.01); *B29C 66/73116* (2013.01); *B29C 66/73182* (2013.01); *B29C 66/73921* (2013.01); *B29C 66/8141* (2013.01); *B29C 66/81427* (2013.01); *B29C 66/81431* (2013.01); *B29C 66/8242* (2013.01); *B29C 66/8322* (2013.01); *B29C 66/9512* (2013.01); *F21S 45/30* (2018.01); *F21V 31/03* (2013.01); *H05K 5/0213* (2013.01); *B29C 65/18* (2013.01); *B29C 65/58* (2013.01); *B29C 65/7841* (2013.01); *B29C 66/472* (2013.01); *B29C 66/55* (2013.01); *B29C 66/61* (2013.01); *B29C 66/7212* (2013.01); *B29C 66/929* (2013.01); *B29C 66/944* (2013.01); *B29C 66/9513* (2013.01); *B29K 2309/08* (2013.01); *B29K 2627/18* (2013.01); *B29K 2867/006* (2013.01); *B29K 2995/0065* (2013.01); *B29K 2995/0069* (2013.01); *B29L 2031/3481* (2013.01); *B29L 2031/747* (2013.01); *B29L 2031/749* (2013.01); *B29L 2031/7506* (2013.01)

(58) Field of Classification Search
CPC .............. B29C 66/232; B29C 66/8141; B29C 66/81427; B29C 66/81431
USPC ....................................................... 156/73.1
See application file for complete search history.

(56) References Cited

U.S. PATENT DOCUMENTS

| | | |
|---|---|---|
| 8,727,844 B2 | 5/2014 | Furuyama et al. |
| 2010/0206458 A1 | 8/2010 | Yamada et al. |

FOREIGN PATENT DOCUMENTS

| | | |
|---|---|---|
| JP | 5-154355 | 6/1993 |
| JP | 7-505836 | 6/1995 |
| JP | 2006-142705 | 6/2006 |
| JP | 2006240293 A | 9/2006 |
| JP | 2006-324260 | 11/2006 |
| JP | 2009-078866 | 4/2009 |
| WO | 93/210002 | 10/1993 |
| WO | 98/31966 | 7/1998 |

OTHER PUBLICATIONS

Extended European Search Report issued for corresponding European Patent Application No. 15779897.6, dated Dec. 4, 2017, 8 pages.

* cited by examiner

GAS-PERMEABLE MEMBER AND METHOD FOR PRODUCING THE SAME

TECHNICAL FIELD

The present invention relates to gas-permeable members such as a vent member and a waterproof sound-transmitting member and a method for producing such gas-permeable members.

BACKGROUND ART

Housings for automotive electrical components such as lamps, sensors, and electronic control units (ECUs) are provided with vent members that prevent entry of foreign matters into the housings while ensuring ventilation between the interior and exterior of the housings. For example, Patent Literature 1 describes a gas-permeable membrane bonded or welded to the opening portion of an automotive lamp housing.

Patent Literature 1 discloses bonding and welding as examples of the method for fixing the gas-permeable membrane to a resin component such as a lamp housing. Bonding is an easy way but has disadvantages such as a relatively low productivity and a time-dependent decrease in bond strength. On the other hand, welding has the disadvantage of poor material compatibility. In particular, when the gas-permeable membrane is made of a fluororesin and the resin component is made of a thermoplastic resin, it is not easy to weld the gas-permeable membrane to the resin component. Therefore, a welding rib is conventionally provided on the surface of the resin component. The weld strength between the resin component and the gas-permeable membrane can be increased by melting and solidifying the welding rib on the surface of the resin component while pressing the gas-permeable membrane against the welding rib (Patent Literature 2).

CITATION LIST

Patent Literature

Patent Literature 1: JP 2006-324260 A
Patent Literature 2: JP 2009-078866 A

SUMMARY OF INVENTION

Technical Problem

According to the method of Patent Literature 2, an increase in the weld strength can be expected but the resin component cannot be used without a welding rib. Thus, there is a need for a technique for achieving sufficient weld strength without the use of a welding rib.

It is an object of the present invention to increase the weld strength between a resin component and a resin membrane.

Solution to Problem

That is, the present disclosure provides a method for producing a gas-permeable member, including welding a gas-permeable porous fluororesin membrane made of a fluororesin to a resin component made of a thermoplastic resin using a welding horn having a working surface adapted to be brought into contact with a work object, the working surface being provided with a projection.

In another aspect, the present disclosure provides a gas-permeable member including:
a resin component made of a thermoplastic resin; and
a gas-permeable porous fluororesin membrane made of a fluororesin and attached to the resin component, wherein
the porous fluororesin membrane is welded to the resin component using a welding horn having a working surface adapted to be brought into contact with a work object, the working surface being provided with a projection.

Advantageous Effects of Invention

With the above-described technique, the gas-permeable porous fluororesin membrane is welded to the resin component. The working surface of the welding horn is provided with a projection. This projection allows the load of the welding horn to be easily concentrated at the interface between the porous fluororesin membrane and the resin component. As a result, the weld strength between the resin component and the porous fluororesin membrane can easily be increased.

DESCRIPTION OF EMBODIMENTS

Hereinafter, embodiments of the present invention will be described with reference to the drawings. The present invention is not limited to the following embodiments.

First Embodiment

Figure 1:
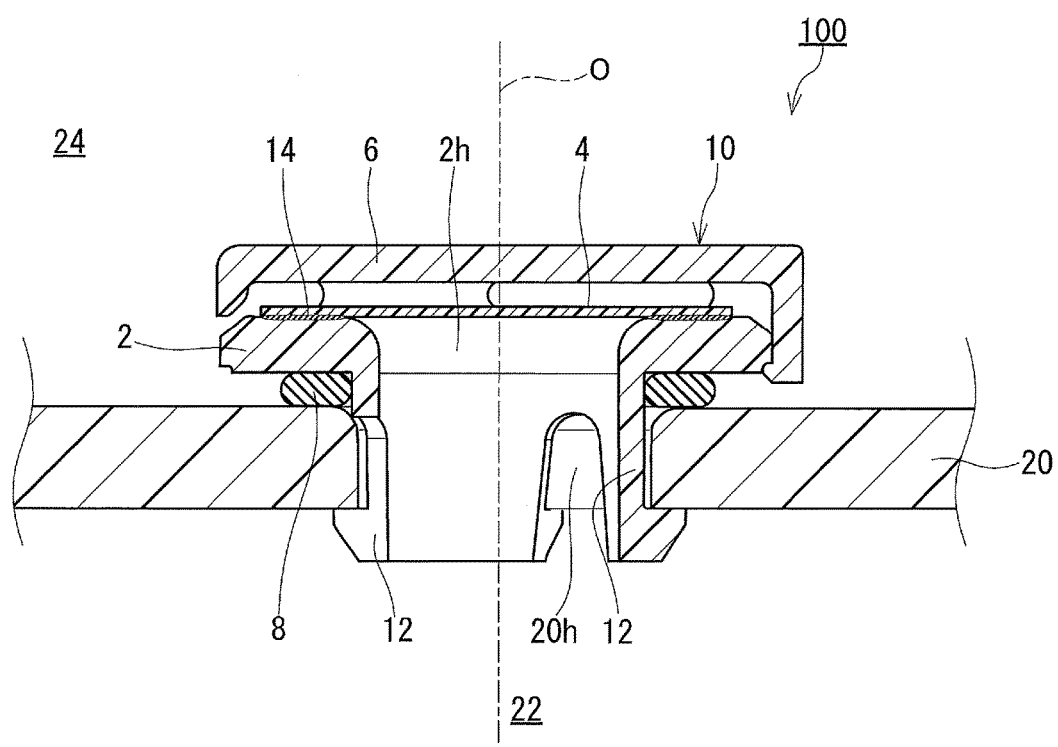
FIG. 1 is a longitudinal sectional view of a vent member according to a first embodiment of the present invention.

As shown in FIG. 1, a vent member 10 according to the present embodiment includes a support body 2, a gas-permeable membrane 4, a cover 6, and a seal ring 8. The vent member 10 is attached, for example, to an opening portion 20h of a housing 20 (specifically, to a lid portion of the housing). The vent member 10 and the housing 20 form a vent structure 100.

The housing 20 is a housing used to accommodate electrical components and/or mechanical components. The housing 20 is typically a housing for automotive components such as a lamp, a motor, a sensor, a switch, an ECU, and a gear box. The housing 20 can also be used as a housing for accommodating components, such as an electronic bulletin board and a road sign, other than the above-mentioned automotive components. The vent member 10 is a member for providing ventilation to the interior of the housing 20 while preventing entry of liquids and solids into the housing 20. The gas-permeable membrane 4 allows passage of gases between the interior space 22 and the exterior space 24 of the housing 20 while preventing entry of liquids and solids into the interior space 22.

In the present embodiment, the support body 2 is a resin component made of a thermoplastic resin. The gas-permeable membrane 4 is a gas-permeable porous fluororesin membrane made of a fluororesin. In the present embodiment, the gas-permeable membrane 4 consists of a porous fluororesin membrane and includes no other components such as a reinforcing member. The thermoplastic resin has a relatively low melting point, while the fluororesin has a relatively high melting point. The support body 2 has a through hole 2h serving as a gas passage. The gas-permeable membrane 4 is welded to the upper surface of the support body 2 so as to cover the through hole 2h. When the thermoplastic resin forming the support body 2 melts and solidifies, a welding portion 14 is formed between the support body 2 and the gas-permeable membrane 4. The welding portion 14 has, for example, an annular shape in plan view.

Examples of the thermoplastic resin forming the support body 2 include polypropylene, polybutylene terephthalate, acrylonitrile-butadiene-styrene copolymer, and polycarbonate. The melting points of these thermoplastic resins are about 100 to 200° C. The thermoplastic resin forming the support body 2 may contain an additive such as glass fibers. Examples of the fluororesin forming the gas-permeable membrane 4 include polytetrafluoroethylene (PTFE), polychlorotrifluoroethylene, tetrafluoroethylene-hexafluoropropylene copolymer, and tetrafluoroethylene-ethylene copolymer. The melting points of these fluororesins are about 250 to 350° C. The thickness of the gas-permeable membrane 4 is not particularly limited, and it is 0.1 to 0.5 mm, for example. In the case where the gas-permeable membrane 4 is not protected by a cover or the like as in the second embodiment, it is recommended that the gas-permeable membrane 4 have a relatively large thickness (of 0.2 to 0.4 mm, for example). It is easy to weld the gas-permeable membrane 4 having a small thickness, like a membrane consisting of a thin fluororesin membrane or a membrane composed of a thin fluororesin membrane and a reinforcing member, because such a thin membrane has high heat conductivity and high vibration transmissibility. On the other hand, it is difficult to weld the gas-permeable membrane 4 having a large thickness because such a thick membrane has lower heat conductivity and lower vibration transmissibility. Therefore, it is particularly recommended to apply the technique described in the present description to the gas-permeable membrane having a large thickness.

The cover 6 is attached to the support body 2 to protect the gas-permeable membrane 4. The cover 6 may be made of the same material as that of the support body 2, or may be made of a material different from that of the support body 2.

The support body 2 has a plurality of leg portions 12. In the vent structure 100, the leg portions 12 of the support body 2 are fitted in the opening portion 20h of the housing 20. The leg portions 12 are engaged with the inner surface of the housing 20. Thus, the vent member 10 is secured to the housing 20. The seal ring 8 is disposed between the lower surface of the support body 2 and the outer surface of the housing 20. The gap between the support body 2 and the housing 20 is sealed by the seal ring 8. The seal ring 8 is made of an elastomer. Examples of the elastomer include nitrile rubber, ethylene-propylene rubber, silicone rubber, fluororubber, acrylic rubber, and hydrogenated nitrile rubber.

The housing 20 is composed of two or more parts, for example, a lid portion and a bottom portion. The opening portion 20h to which the vent member 10 is to be attached may be formed in any part of the housing 20. The housing 20 is made of a resin, for example. However, in the present embodiment, the material of the housing 20 is not limited. The housing 20 may be made of a metal.

Next, a method for producing the vent member 10 shown in FIG. 1 is described.

First, the support body 2, the gas-permeable membrane 4, and the cover 6 are prepared. The support body 2 and the cover 6 can each be produced by a known resin molding method such as injection molding. A fluororesin membrane serving as the gas-permeable membrane 4 can be produced by a known fluororesin molding method such as stretching or extraction. A porous PTFE membrane suitable for use as the gas-permeable membrane 4 is available from Nitto Denko Corporation, for example.

Next, the gas-permeable membrane 4 is welded to the support body 2. In this step, a welding machine 300 shown in FIG. 2 can be used. In the present embodiment, the welding machine 300 is an ultrasonic welding machine and includes an anvil 60, a welding horn 62, an ultrasonic transducer 64, a cylinder 65, an air compressor 66, an ultrasonic oscillator 67, and a controller 68. That is, the welding horn 62 can be a welding horn for ultrasonic welding. Ultrasonic welding can achieve high strength welding with high productivity. The configuration of the welding machine 300 is the same as that of a commercially available welding machine, except for the welding hone 62.

The support body 2 (resin component) to which the gas-permeable membrane 4 is to be welded is placed on the anvil 60. The cylinder 65 brings the welding horn 62 and the ultrasonic transducer 64 close to the gas-permeable membrane 4 using compressed air generated by the air compressor 66 and adjusts the pressure of the welding horn 62 to be applied to the gas-permeable membrane 4. The controller 68 controls the ultrasonic oscillator 67 so as to adjust the frequency of ultrasonic vibration to be applied to the welding horn 62 through the ultrasonic transducer 64.

In the present embodiment, the welding horn 62 is a welding horn having a working surface 62p adapted to be brought into contact with the gas-permeable membrane 4 as a work object, and the working surface 62p is provided with projections 62t. With this welding horn, the load of the welding horn 62 is easily concentrated at the interface between the gas-permeable membrane 4 and the support body 2. As a result, the weld strength between the support body 2 and the gas-permeable membrane 4 can easily be increased. The welding horn 62 is made of a metal such as an aluminum alloy, a titanium alloy, or the like.

Figure 3:
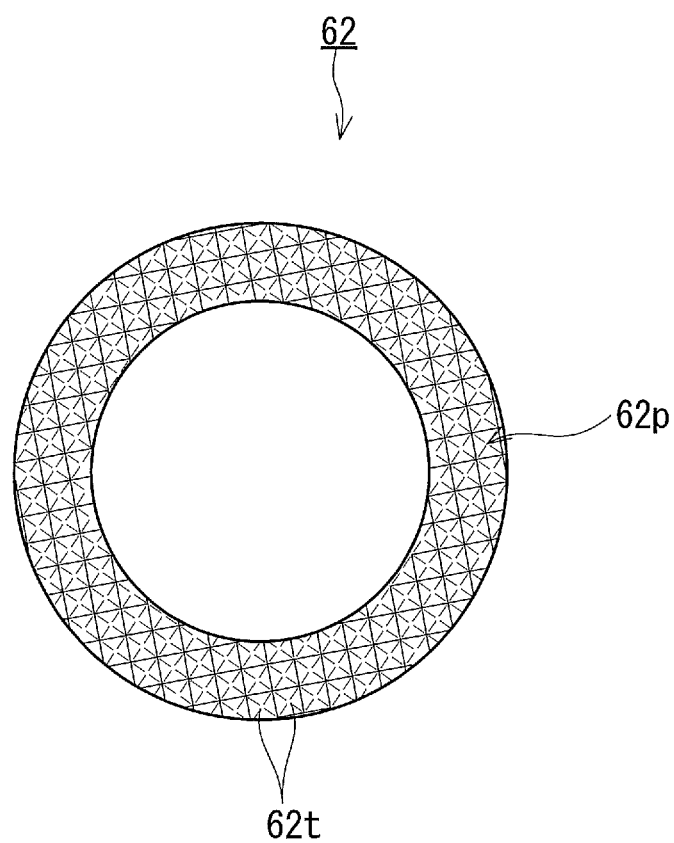
FIG. 3 is a plan view of a working surface of a welding horn.

As shown in FIG. 3, the working surface 62p of the welding horn 62 has an annular shape in plan view. The working surface 62p is provided with a plurality of projections 62t. The plurality of projections 62t are arranged in a grid pattern (crisscross pattern) on the working surface 62p. The projections 62t each have a square pyramidal shape. In other words, the projections 62t each have a square shape in plan view. The projections 62t having this shape are arranged with no space therebetween (most closely) on the working surface 62p. With this arrangement, the load of the welding horn 62 is easily concentrated at the interface between the gas-permeable membrane 4 and the support body 2. In addition, the weld strength between the support body 2 and the gas-permeable membrane 4 can easily be increased.

Figure 4:
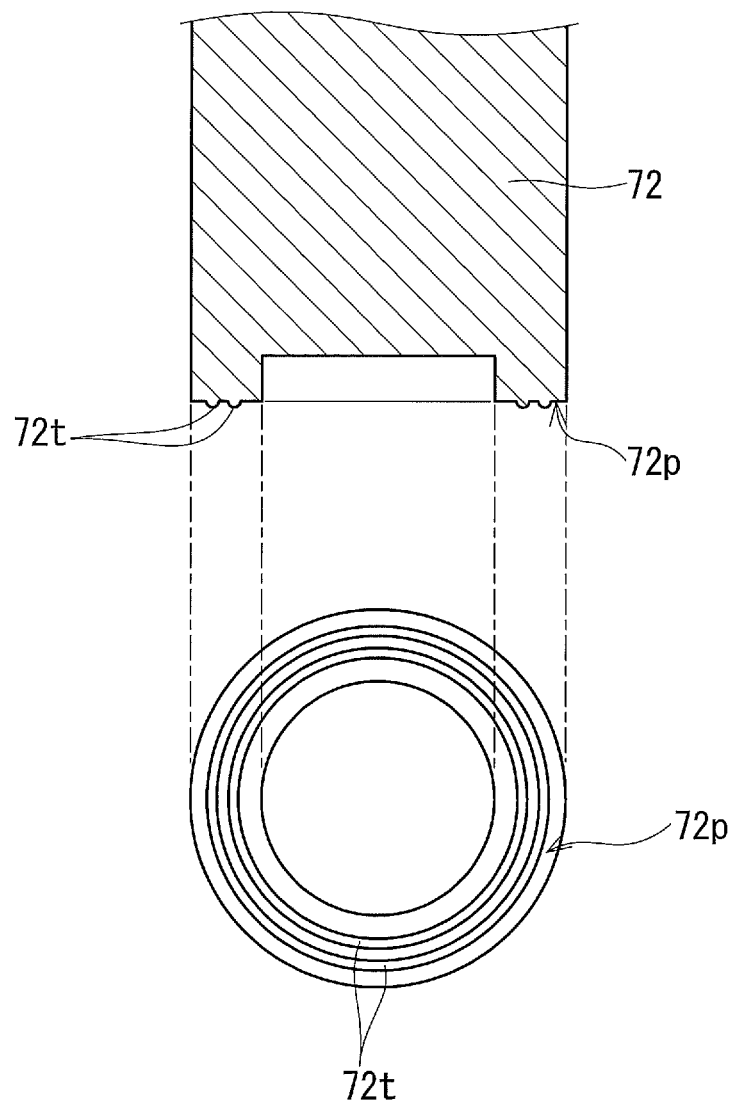
FIG. 4 is a cross-sectional view and a plan view of another welding horn.

A welding horn 72 shown in FIG. 4 can also be used instead of the welding horn 62 shown in FIG. 3. The working surface 72p of the welding horn 72 has an annular shape (ring shape) in plan view. The working surface 72p is provided with two projections 72t. The projections 72t each have an annular shape concentric with the working surface 72p in plan view. Also with this projections 72t, the load of the welding horn 72 is easily concentrated at the interface between the gas-permeable membrane 4 and the support body 2. The number of the projections 72t is not limited to two. The working surface 72p may be provided with only one projection 72t or three or more projections 72t.

As can be understood from the examples shown in FIG. 3 and FIG. 4, the shape of the projections on the working surface of the welding horn can be changed as appropriate depending on the thickness of the gas-permeable membrane 4, the type of the resin of the support body 2, etc.

Figure 2:
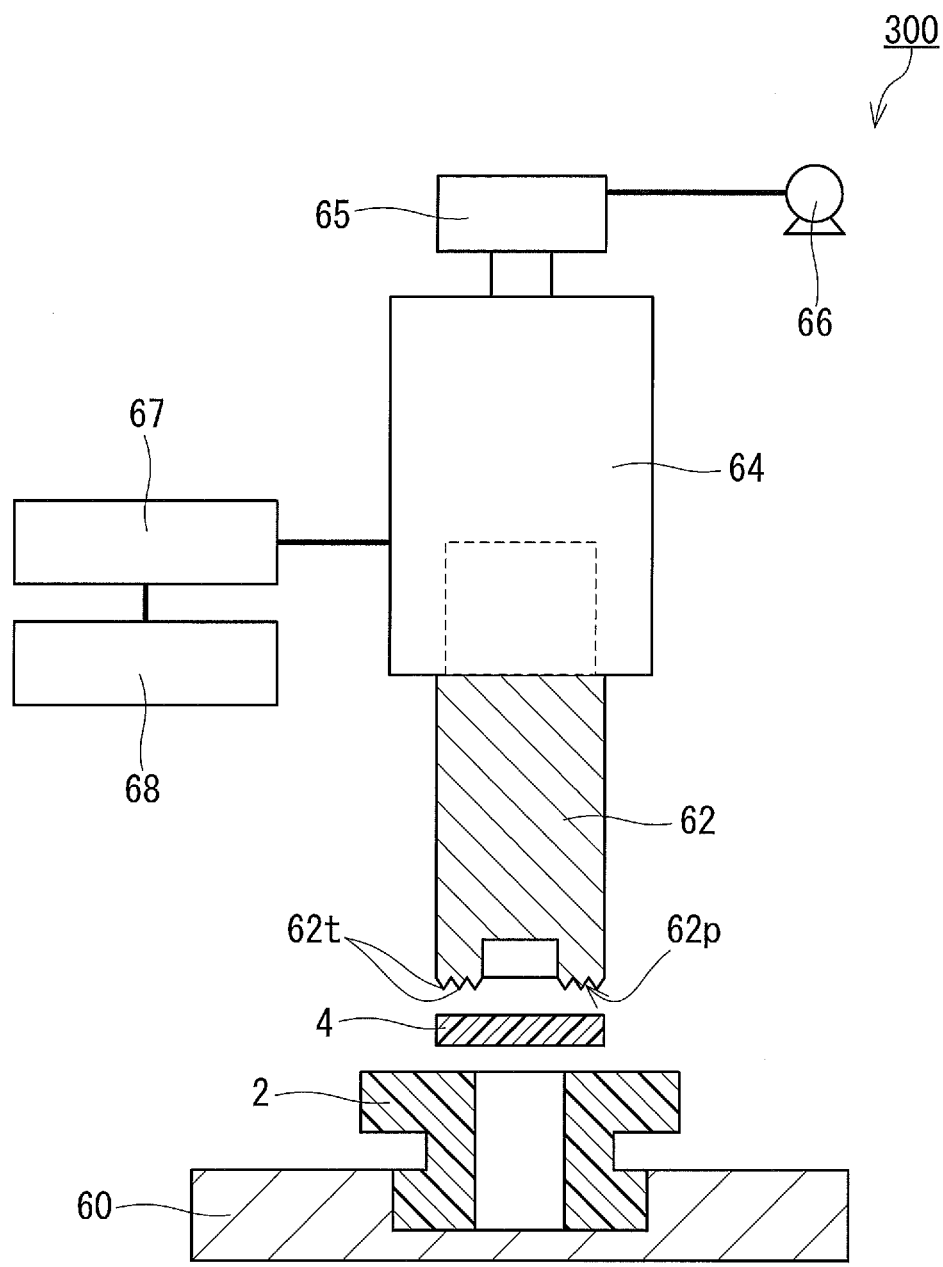
FIG. 2 is a configuration diagram of an ultrasonic welding machine used for production of the vent member shown in FIG. 1.

A heat welding machine may be used instead of the ultrasonic welding machine 300 to weld the gas-permeable membrane 4 to the support body 2. Generally, in an ultrasonic welding machine, a part of a resin component (support body 2) is melted by frictional heat. In a heat welding machine, a part of a resin component is melted by heat of a welding horn itself. FIG. 2 shows the configuration of a heat welding machine when the ultrasonic transducer 64 is replaced by a heater and the ultrasonic oscillator 67 and the controller 68 are replaced by a temperature controller. The welding horn 62 can be a welding horn for heat welding.

Next, a gas-permeable member according to the second embodiment is described. The elements of the second embodiment corresponding to those of the first embodiment are denoted by the same reference numerals, and the description thereof may be omitted. That is, the description of the first embodiment can be applied to that of the second embodiment, and vice versa, unless a technical contradiction arises. Furthermore, these embodiments may be combined with each other unless a technical contradiction arises.

Second Embodiment

Figure 5A:
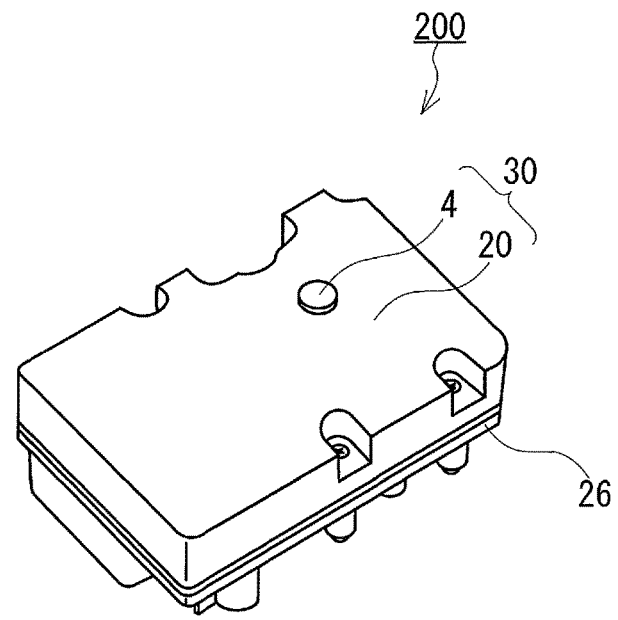
FIG. 5A is a perspective view of a housing provided with a vent member (a lid portion of the housing provided with a gas-permeable membrane) according to a second embodiment of the present invention.
Figure 5B:
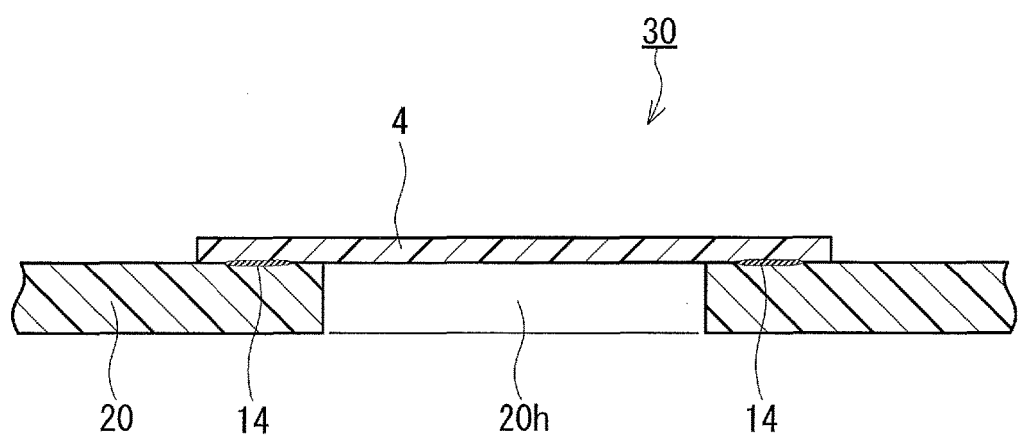
FIG. 5B is a partial cross-sectional view of the housing shown in FIG. 5A.

As shown in FIG. 5A and FIG. 5B, the gas-permeable membrane 4 may be provided in a housing 200. The housing 200 is composed of two or more parts including a first portion 20 and a second portion 26. For example, the first portion 20 corresponds to a lid portion and the second portion 26 corresponds to a bottom portion. The first portion 20 and the second portion 26 are made of a thermoplastic resin, as in the case of the support body 2 of the vent member 10 of the first embodiment. In the present embodiment, an opening portion 20h for ventilation is formed in the first portion 20. The gas-permeable membrane 4 is welded to the first portion 20 so as to cover the opening portion 20h. The opening portion 20h for ventilation may be formed in the second portion 26, or the opening portions 20h may be formed in both the first portion 20 and the second portion 26. The first portion 20 of the housing 200 and the gas-permeable membrane 4 form a vent member 30 (gas-permeable member) for providing ventilation while preventing entry of liquids and solids.

As shown in FIG. 5B, a welding portion 14 is formed between the gas-permeable membrane 4 and the first portion 20 of the housing 200. The welding portion 14 has an annular shape in plan view. Also in the present embodiment, the gas-permeable membrane 4 is welded to the first portion 20 of the housing 200 using the welding horn 62 or 72 described with reference to FIG. 3 or FIG. 4.

(Others)

In each of the embodiments, a rib for increasing the weld strength is not provided on the upper surface of the resin component (the support body 2 or the first portion 20 of the housing) before the gas-permeable membrane 4 is welded thereto. However, such a rib may be previously provided on the upper surface of the resin component.

In each of the embodiments, the gas-permeable membrane 4 serves to ventilate the housing and to control the pressure in the housing. That is, the gas-permeable membrane 4 is a ventilation membrane. However, the gas-permeable membrane 4 is not limited to a ventilation membrane. The gas-permeable member that should be produced by the method disclosed in this description may be a waterproof sound-transmitting member for allowing transmission of sound while preventing entry of water. Such waterproof sound-transmitting members each including the gas-permeable membrane 4 are provided in an earpiece and a mouthpiece of a communication device such as a mobile phone.

EXAMPLES

Example

A housing component (a lid portion of an ECU housing: see FIG. 5A) made of a resin material containing 30 mass % of glass fibers and 70 mass % of polybutylene terephthalate was prepared. An opening portion with a diameter of 5 mm was formed in the housing component, and then an ultrasonic welding machine (small-sized precision press series manufactured by Seidensha Electronics Co., Ltd.) was used to weld a porous PTFE membrane (NTF 810A manufactured by Nitto Denko Corporation, with a thickness of 0.3 mm and a diameter of 10 mm) to the housing component so as to cover the opening portion. The frequency of the ultrasonic wave was 28.5 kHz, the welding time was 0.16 seconds, and the welding pressure (air pressure) was 0.15 MPa. A welding horn having the structure described with reference to FIG. 2 and FIG. 3 was used. Thus, a vent member of Example composed of the porous PTFE membrane and the housing component was obtained.

Comparative Example

An attempt to weld a porous PTFE membrane to an opening portion of a housing component was made under the same conditions as those of Example, except that a welding horn having a flat working surface was used. However, the porous PTFE membrane could not welded to the housing component and easily detached from the housing component.

[Water Resistance Test]

The water entry pressure of the vent member of Example was tested according to Japanese Industrial Standards (JIS) L 1092 (Method B: high hydraulic pressure method). Specifically, the hydraulic pressure (water entry pressure) at which water leakage occurred was measured. Table 1 shows the results. As shown in Table 1, the water entry pressure of the vent member of Example was high enough. When the porous PTFE membrane could be welded to the housing component without any problems as in Example, the welding result was rated as "good". When the porous PTFE membrane could not be welded to the housing component as in Comparative Example, the welding result was rated as "not good".

TABLE 1

|  | Welding method | Welding pressure (MPa) | Welding time (sec) | Water entry pressure (kPa) | Welding result |
|---|---|---|---|---|---|
| Example | Ultrasonic welding | 0.15 | 0.18 | 200 | Good |
| Com. Example |  |  |  | — | Not good |

INDUSTRIAL APPLICABILITY

The technique disclosed in this description can be applied to production of gas-permeable members such as a vent member and a waterproof sound-transmitting member.

The invention claimed is:

1. A method for producing a gas-permeable member, comprising welding a gas-permeable porous fluororesin membrane made of a fluororesin to a resin component made of a thermoplastic resin other than a fluororesin using a welding horn having a working surface adapted to be brought into contact with a work object, the working surface being provided with a plurality of projections, wherein
the resin component is a support body used for a vent member for providing ventilation to an interior of a housing, a support body used for a waterproof sound-transmitting member for allowing transmission of sound while preventing entry of water, or a part of a housing.

2. The method for producing a gas-permeable member according to claim 1, wherein
the projections are arranged in a grid pattern on the working surface.

3. The method for producing a gas-permeable member according to claim 1, wherein
the working surface has an annular shape in plan view, and
the projection has an annular shape concentric with the working surface in plan view.

4. The method for producing a gas-permeable member according to claim 1, wherein the welding horn is a welding horn for ultrasonic welding.

5. The method for producing a gas-permeable member according to claim 1, wherein the gas-permeable member is (a) the vent member for providing ventilation while preventing entry of liquids and solids or (b) the waterproof sound-transmitting member for allowing transmission of sound while preventing entry of water.

6. The method for producing a gas-permeable member according to claim 1, wherein
the melting point of the thermoplastic resin forming the resin component is in the range of 100 to 200° C., and
the melting point of the fluororesin forming the gas-permeable porous fluororesin membrane is in the range of 250 to 350° C.

7. The method for producing a gas-permeable member according to claim 1, wherein the thermoplastic resin forming the resin component comprises at least one selected from the group consisting of polypropylene, polybutylene terephthalate, acrylonitrile-butadiene-styrene copolymer, and polycarbonate.

8. The method for producing a gas-permeable member according to claim 1, wherein the fluororesin forming the gas-permeable porous fluororesin membrane comprises at least one selected from the group consisting of polytetrafluoroethylene, polychlorotrifluoroethylene, tetrafluoroethylene-hexafluoropropylene copolymer, and tetrafluoroethylene-ethylene copolymer.

* * * * *